United States Patent [19]

Ong

[11] Patent Number: 5,745,499

[45] Date of Patent: Apr. 28, 1998

[54] SUPERVOLTAGE DETECTION CIRCUIT HAVING A MULTI-LEVEL REFERENCE VOLTAGE

[75] Inventor: Adrian E. Ong, San Jose, Calif.

[73] Assignee: Micron Technology, Inc., Boise, Id.

[21] Appl. No.: 540,915

[22] Filed: Oct. 11, 1995

[51] Int. Cl.$^6$ ........................................ G01R 31/28
[52] U.S. Cl. ........................... 371/21.4; 365/189.09
[58] Field of Search ........................... 371/21.4, 21.1, 371/22.5, 28, 27.5; 365/201, 189.09, 241, 189.11; 327/404, 546; 324/158 R, 765; 395/183.06; 364/489, 490

[56] References Cited

U.S. PATENT DOCUMENTS

| | | | |
|---|---|---|---|
| 5,155,704 | 10/1992 | Walther et al. | 365/201 |
| 5,212,442 | 5/1993 | O'Toole et al. | 324/158 R |
| 5,245,522 | 9/1993 | Kawaguchi et al. | 363/37 |
| 5,260,646 | 11/1993 | Ong | 323/349 |
| 5,283,762 | 2/1994 | Fujishima | 365/189.09 |
| 5,311,481 | 5/1994 | Casper et al. | 365/230.06 |
| 5,349,559 | 9/1994 | Park et al. | 365/201 |
| 5,448,199 | 9/1995 | Park | 327/546 |
| 5,452,253 | 9/1995 | Choi | 365/201 |
| 5,465,232 | 11/1995 | Ong et al. | 365/189.05 |
| 5,493,532 | 2/1996 | McClure | 365/201 |
| 5,497,117 | 3/1996 | Nakajima et al. | 327/404 |
| 5,532,618 | 7/1996 | Hardee et al. | 326/63 |

*Primary Examiner*—Robert W. Beausoliel, Jr.
*Assistant Examiner*—Nadeem Iqbal
*Attorney, Agent, or Firm*—Schwegman, Lundberg, Woessner & Kluth, P.A.

[57] ABSTRACT

An integrated memory circuit is described which can be tested using both a burn-in test and an application specific test. The application specific test is initiated by providing a supervoltage on one of the integrated memory circuit external input pins. A reference voltage circuit is described for producing a variable or multi-level reference voltage used by a supervoltage detection circuit. If a burn-in test is being performed, the reference voltage is adjusted from a level used when the memory is not operating in a burn-in test mode. A multi-level reference voltage is provided to the supervoltage detection circuit, thereby, adjusting the supervoltage level needed to initiate an application specific test.

20 Claims, 4 Drawing Sheets

SUPERVOLTAGE DETECTION CIRCUIT HAVING A MULTI-LEVEL REFERENCE VOLTAGE

TECHNICAL FIELD OF THE INVENTION

The present invention relates generally to integrated circuit memories and in particular the present invention relates to supervoltage detection circuits in integrated circuit memories.

BACKGROUND OF THE INVENTION

Integrated circuits, as with any manufactured product, are susceptible to defects. These defects can often be identified through 'burn-in' testing conducted at specification extremes. This testing assists in identifying infant failures by forcing the integrated circuit to operate at temperature and voltage extremes.

Alternate testing can be conducted on an integrated circuit to test application specific features. These can be tests conducted at both normal operating voltages and burn-in level voltages. Further, these alternate tests are typically conducted by the manufacture and not intended to be used by a purchaser of the integrated circuit. As such, an electronic key is typically provided to allow the manufacture to initiate an application specific test mode. In integrated memory circuits one of the external input pins is typically used to access the key. By placing a voltage on the input pin which is a predetermined level above the maximum specified supply voltage, the memory circuit enters a specific test mode. This voltage level is referred to as a supervoltage. A supervoltage detector circuit is, therefore, provided to detect when a supervoltage is presented on the external input pin.

Consumer demand for memory circuits having increased memory capacity has created a generation of memory circuits which operate at supply voltages as low 3.3 volts. These memory circuits have an increased density and due to fabrication constraints have a lower breakdown voltage level than prior 5 volt memories. A problem occurs when a memory circuit is being burn-in tested and an application specific test is initiated. To conduct a burn-in test the supply voltage is raised to an upper voltage limit. To initiate a specific test, a supervoltage which is a predetermined voltage level above the supply voltage must be provided. During burn-in testing this supervoltage level is often above the breakdown voltage for a 3.3 volt memory. As known to those skilled in the art, exceeding the breakdown level of a memory device can be catastrophic and defeat the purpose of burn-in testing.

For the reasons stated above, and for other reasons stated below which will become apparent to those skilled in the art upon reading and understanding the present specification, there is a need in the art for a low voltage memory circuit which can be operated in an application specific test mode during burn-in testing without exceeding breakdown voltage levels.

SUMMARY OF THE INVENTION

The above mentioned problems with integrated circuits and other problems are addressed by the present invention and which will be understood by reading and studying the following specification. An integrated circuit is described which has a supervoltage reference circuit that adjusts a supervoltage reference level.

In particular, the present invention describes an integrated circuit comprising an external input, a supervoltage reference circuit for generating a reference voltage in response to a test mode signal, and a supervoltage detector circuit connected to the external input and the supervoltage reference circuit for detecting a supervoltage provided on the external input. The supervoltage can be a predetermined level above the reference voltage. In one embodiment, the supervoltage reference circuit generates a first reference voltage in response to an active test mode signal, and a second reference voltage in response to an inactive test mode signal. The first reference voltage can be one half of the integrated circuit's supply voltage level and the second reference voltage is equal to the supply voltage level.

In another embodiment, an integrated memory circuit is described which comprises an external input, and a test mode detector circuit for producing a test mode signal in response to a burn-in test. The memory circuit also comprises a supervoltage reference circuit for generating first and second reference voltages in response to the test mode signal, and a supervoltage detector circuit connected to the external input and the supervoltage reference circuit for detecting a supervoltage a predetermined level in excess of the reference voltages and provided on the external input.

In yet another embodiment, a method of detecting a supervoltage in a memory circuit is described. The method comprises the steps of generating a test mode signal in response to an operating state of the memory circuit, generating a reference voltage based upon the test mode signal, and triggering a detection circuit if a voltage received on an external input exceeds the reference voltage by a predetermined level. The method can further include the steps of generating a first reference voltage if the test mode signal is active, and generating a second reference voltage if the test mode signal is inactive

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
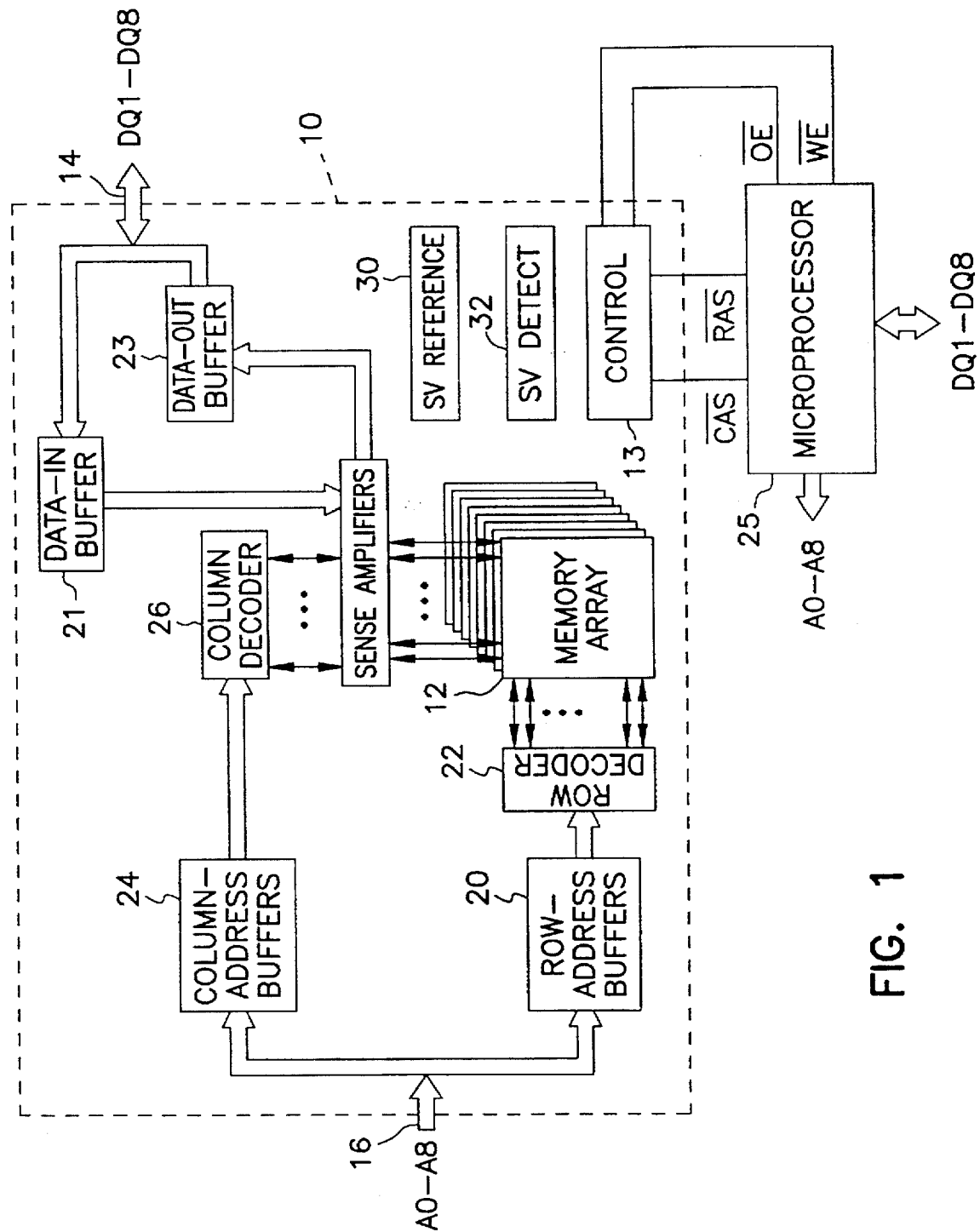
FIG. 1 is an integrated memory circuit incorporating the features of the present invention.

FIG. 1 illustrates a block diagram of a DRAM 10 incorporating the present invention. Detailed elements of portions of the memory have been left out of the figure to focus on the features more directly relevant to the present invention. Such omitted detailed elements of the operation of DRAMs and their applications are known to one skilled in the art.

While a DRAM is illustrated, the functions and methods described below are equally applicable to types of memory devices, including but not limited to multi-port memories, synchronous dynamic random access memories (SDRAM) and static random access memories (SRAM).

The DRAM 10 of FIG. 1 includes a DRAM array 12 which can be accessed by a microprocessor 25 through input/output connections including address lines A0–A8. In the embodiment described, the DRAM array 12 is a 512 by 512 by 8 bit array; however, the array may be any other configuration. The DRAM array 12 has a plurality of memory registers, each memory register including eight dynamic memory cells. More specifically, the DRAM array 12 includes rows and columns of eight-bit randomly addressable memory registers, with each cell of the memory register being in a different plane of the array 12. In other words, each eight-bit memory register is made up of memory cells from the eight planes having the same row and column addresses, thus forming addressable rows and columns of eight-bit memory registers.

The DRAM 12 is accessed through address bus 16, row and column address strobe signals RAS* and CAS*, write enable signal WE*, an output enable signal OE* and by using other conventional control signals (not shown) which are known to one skilled in the art. Row address latch/buffer 20 and row decoder 22 receive and decode a row address from a row address signal provided on address lines A0–A8, and address a corresponding row of the DRAM array 12. Likewise, column address latch/buffer 24 and column decoder 26 receive and decode a column address from a column address signal provided on address lines A0–A8, and address the corresponding column of the DRAM array 12.

Data bus 14 receives memory register data during a write cycle from the microprocessor 25 for writing to DRAM array 12. Data stored in the DRAM 12 can be transferred during a read cycle on bus 14. Control logic 13 is used to control the many available functions of the DRAM. Various control circuits and signals not detailed herein initiate and synchronize the DRAM operation as known to those skilled in the art.

Some of the inputs and outputs of DRAM 10 used to communicate with microprocessor 25 are described as follows. Write enable input (WE*) is used to select a read or write cycle when accessing the DRAM. To read the DRAM array, the WE* line is high when CAS* falls. If the WE* line is low when CAS* falls, the DRAM is written to. Row address strobe (RAS*) input is used to clock in the nine row address bits and strobe for WE*, CAS*, and DQ. In standard memories, the RAS* also acts as the master chip enable and must fall for the initiation of any DRAM array or transfer operation. Column address strobe (CAS*) input is used to clock in the nine column address bits.

Address input lines A0–A8 are used to identify a row and column address to select at least one eight-bit word or memory register out of the available memory registers of DRAM array 12, as described above. DRAM data input/output lines DQ1–DQ8 provide data input and output for the DRAM array 12. As stated above, the DRAM description has been simplified for purposes of illustrating the present invention and is not intended to be a complete description of all the features of a DRAM.

Supervoltage Circuitry

It is beneficial to test integrated circuit memories both at specification limits and under application specific operating conditions. Two different types of tests are, therefore, conducted on manufactured memory circuits. The first type of test is a burn-in test which is conducted at specification extremes, including voltage and temperature. For example, a 3.3 volt memory circuit may be specified as operating at a maximum supply voltage of 6 volts. The other type of test is application specific and can include a range of different operational tests. In a memory circuit, such as DRAM 10 shown in FIG. 1, one of the address inputs, for example A7, can be used to activate a test mode. Supervoltage detection circuitry 32 is provided and coupled to address input A7. When a supervoltage is detected on A7 the memory enters a test mode. A series of different test can be included in a memory circuit by using the remaining address inputs for inputting a test identifier.

Traditional supervoltage detector circuits compare the supervoltage input signal to a trip level, which is a predetermined level above the currently used supply voltage. For example, if the memory circuit were a nominal 5 volt device, the supervoltage trip level may be 3 volts above the supply voltage (8 volts). When the device is tested under a burn-in condition of 7 volts, the supervoltage trip level would change to 10 volts.

As a result of increased memory density and changes in fabrication, the supply voltage used for current memory circuits has been reduced to 3.3 volts. Although the memory circuits are designed to be tolerant of higher supply voltages, for example 6 volts, voltage levels substantially above this upper limit can result in damage to the circuitry. The use of a traditional detector circuitry, therefore, would result in damage to the part by requiring a supervoltage of 9 volts during burn-in testing.

Supervoltage reference circuit 30 is provided in memory circuit 10 to adjust a supervoltage reference level if the memory is being tested in a burn-in manner. That is, when a burn-in test is being conducted, the supervoltage reference level is lowered such that a variable reference level, therefore, is used to trigger the supervoltage detector circuit. The differential between the supply voltage and the supervoltage is reduced.

Figure 2:
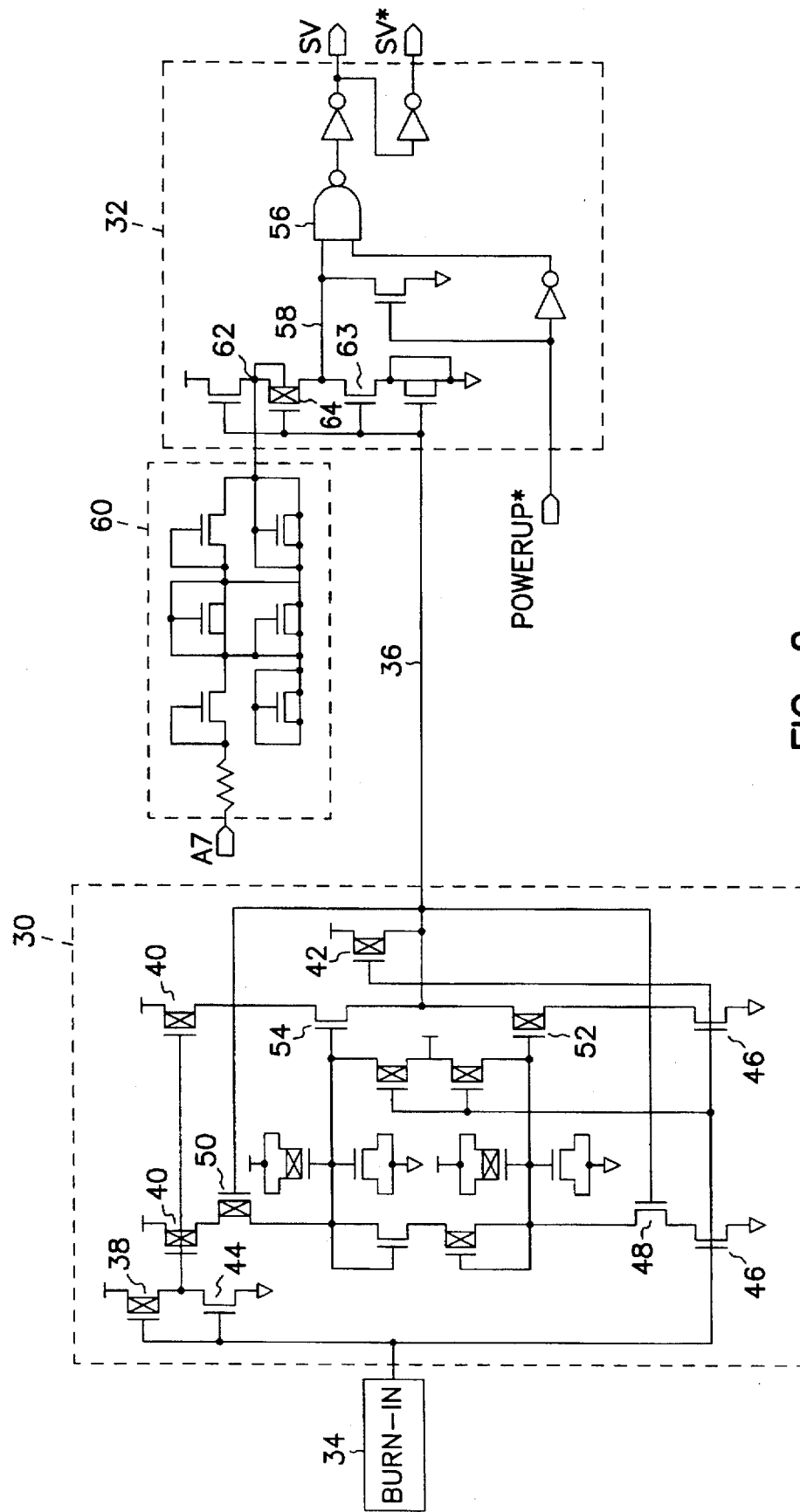
FIG. 2 is a schematic diagram of circuitry included in the memory circuit of FIG. 1.

The supervoltage reference circuit 30 is shown in detail in FIG. 2. An active high signal is provided from burn-in circuit 34 to indicate when the memory circuit is in a burn-in test mode. The burn-in circuit preferably detects a burn-in test by monitoring the supply voltage. If the supply voltage reaches a predetermined upper limit, the burn-in circuit provides a high output. A supervoltage reference signal is provided on node 36 in response to the burn-in circuit. This signal is normally equal to the supply voltage when the device is not operating in burn-in. When the device is operating in a burn-in condition, the reference signal is reduced to one-half (½) the supply voltage. Pull-up transistor 42 is activated when the burn-in signal is low. When the burn-in signal goes high to indicate that a burn-in test is being performed, transistors 40, 44 and 46 are activated. Feed back transistors 48 and 50 in combination with transistors 52 and 54 balance the reference level output 36 of the supervoltage reference circuit 30 to one-half Vcc. The supervoltage reference level, therefore, changes in response to a burn-in test mode.

Supervoltage detector circuit 32, as shown in FIG. 2, receives the reference voltage 36 and detects a supervoltage provided on external address pin A7. A supervoltage signal (SV) and its complement (SVI) are provided as outputs from the detector circuit. A powerup* signal can be used to latch SV low until the memory circuit has been initially powered up to an appropriate supply level. NAND gate 56 will be latched when Powerup* is high and will follow the inverse of node 58 when powerup* is low. The BURN-In signal will activate when Vcc is at a designated burn-in voltage, e.g. 5.5 volts.

Figure 3:
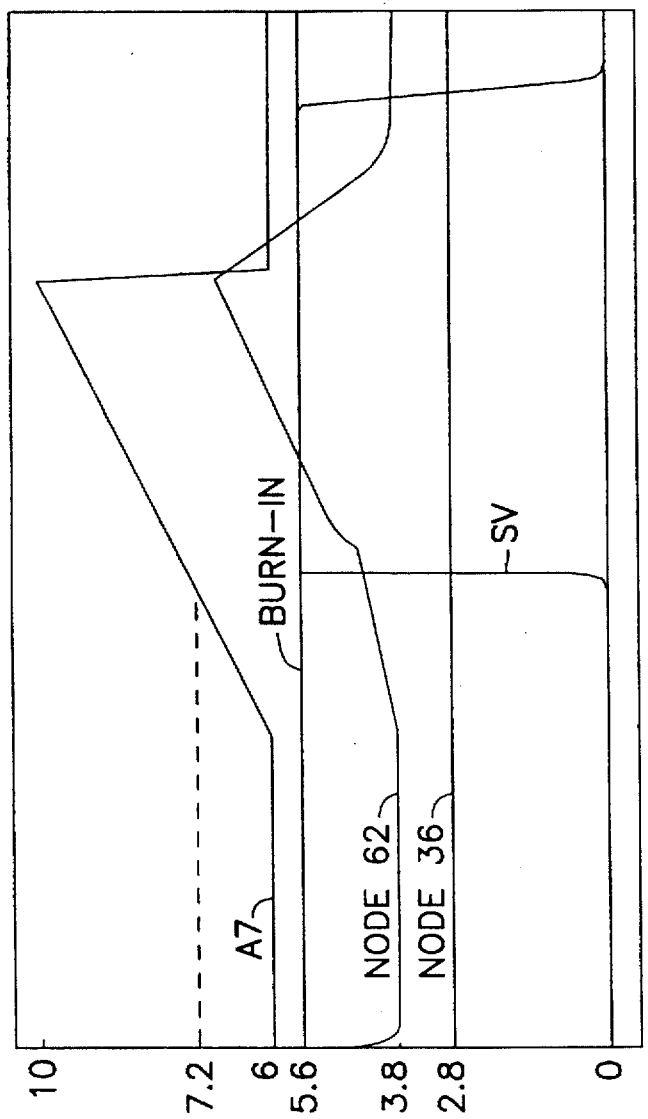
FIG. 3 is a graph of the operation of the circuitry of FIG. 2.
Figure 4:
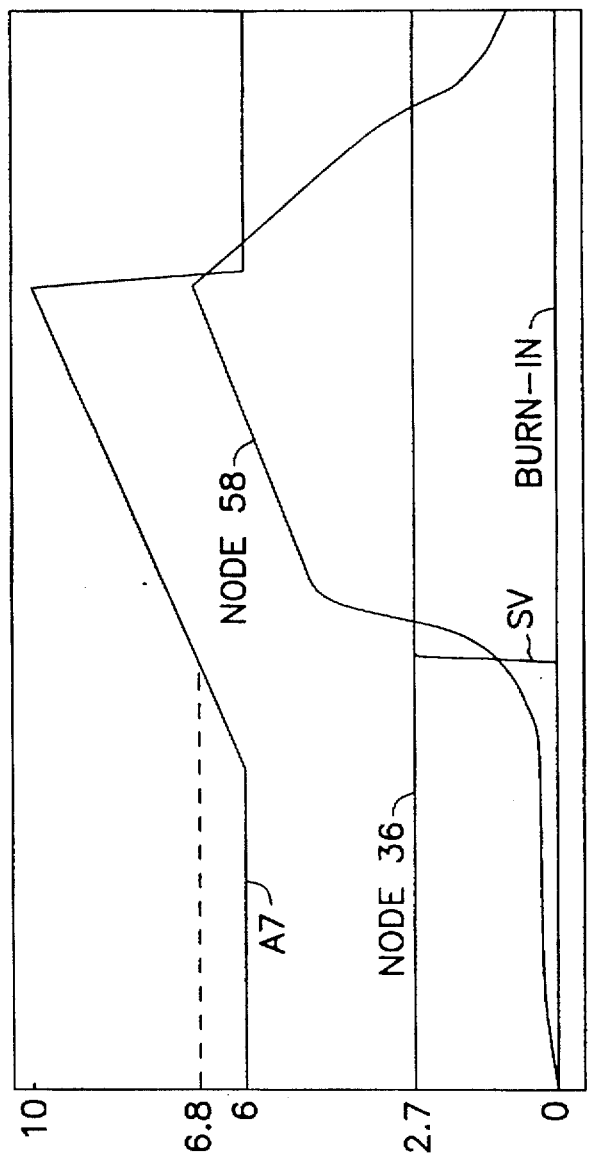
FIG. 4 is another graph of the operation of the circuitry of FIG. 2.

To fully understand the reference circuit 30 and detector circuit 32 reference is made to the diagrams of FIGS. 3 and 4, voltage is shown on the Y-axis and time is platted on the X-axis. FIG. 3 illustrates the reference circuit and detector circuit operations when a burn-in mode is activated. The voltage provided on address pin A7 is tolerant of a voltage higher than the supply voltage, but circuit 60 will scale the voltage level down for use in the detector circuit. With the burn-in signal equal to Vcc (5.6 volts), the supervoltage reference level 36 is approximatly Vcc/2. As the voltage on node 62 exceeds the reference voltage (node 36) by a threshold voltage, transistor 64 will begin to turn on. When a sufficient voltage (approximately 4.2 volts) is reached, node 58 is pulled to a high level. SV will goes high in response to NAND gate 56. The voltage on the external address pin, therefore, triggered the supervoltage at 7.2 volts. The actual trip level, for the detection circuit, however, is much lower.

FIG. 4 illustrates the operation of the reference circuit 30 and the detector circuit 32 under normal operating conditions. The Burn-in signal is low and the reference voltage is equal to a nominal Vcc (2.7 volts). As explained above, transistor 64 will begin to turn on when node 62 is a threshold voltage above the reference voltage. When a sufficient voltage is reached, node 58 is pulled to a high level. When node 58 reaches the trigger level of NAND gate 56 (approximately 1 volt) the supervoltage SV will go high. The voltage on the external address pin, therefore, triggered the supervoltage at 6.8 volts.

The supervoltage reference circuit 30 adjusts the reference voltage accordingly when the memory device is operating in a burn-in test mode. The memory device illustrated is designed to be tolerant of voltages up to 6 volts. Thus the address pin A7 is shown in FIGS. 3 and 4 as starting at a 6 volt level. The external supervoltage must be above this tolerance voltage to avoid accidental activation of the supervoltage detection circuit. It will be understood that any reference level can be used and is not limited to the levels described herein. Further, similar detection circuitry can be provided to more address pins to provide greater flexibility during testing.

Conclusion

An integrated memory circuit has been described which can be tested in both a burn-in mode and application specific test mode. By applying a supervoltage to one of the memory circuit's external inputs the application specific test mode can be initiated. A circuit has been described which adjusts a supervoltage reference voltage such that when a memory is being tested in a burn-in mode the supervoltage trigger level is reduced to avoid damage to the memory. If a burn-in test is being performed, the reference voltage is reduced from the level used when the memory is not operating in a burn-in test mode. The multi-level reference voltage is provided to the supervoltage detection circuit, thereby, adjusting the supervoltage level needed to initiate an application specific test.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:
    an external input;
    a supervoltage reference circuit for generating a variable reference voltage in response to a test mode signal; and
    a supervoltage detector circuit connected to the external input and the supervoltage reference circuit, the supervoltage detector circuit comparing a voltage on the external input with the variable reference voltage for detecting a supervoltage provided on the external input.

2. The integrated circuit of claim 1 wherein the supervoltage is a predetermined level above the variable reference voltage.

3. The integrated circuit of claim 1 wherein the test mode signal indicates a burn-in test mode.

4. The integrated circuit of claim 1 wherein the supervoltage reference circuit generates a first reference voltage in response to an active test mode signal, and a second reference voltage in response to an inactive test mode signal.

5. The integrated circuit of claim 4 wherein the first reference voltage is one half a supply voltage level and the second reference voltage is equal to the supply voltage level.

6. An integrated memory circuit comprising:
    an external input;
    a test mode detector circuit for producing a test mode signal in response to a burn-in test;
    a supervoltage reference circuit for generating first and second reference voltages in response to the test mode signal; and
    a supervoltage detector circuit connected to the external input and the supervoltage reference circuit for detecting a supervoltage, the supervoltage being a predetermined voltage level in excess of the first or second reference voltages and provided on the external input.

7. The integrated circuit memory of claim 6 wherein the external input is a memory address input.

8. The integrated circuit memory of claim 6 wherein the first reference voltage is one half a supply voltage level and the second reference voltage is equal to the supply voltage level.

9. The integrated circuit memory of claim 6 wherein the integrated circuit memory is a low voltage random access memory (RAM).

10. A method of detecting a supervoltage in a memory circuit, the method comprising the steps of:
    generating a test mode signal in response to an operating state of the memory circuit;
    generating a variable reference voltage based upon the test mode signal; and
    triggering a detection circuit if a voltage received on an external input exceeds the variable reference voltage by a pre-determined level.

11. The method of claim 10 further including the steps of:
    generating a first reference voltage if the test mode signal is active; and
    generating a second reference voltage if the test mode signal is inactive.

12. The method of claim 11 wherein the first reference voltage is one half of a supply voltage.

13. The method of claim 11 wherein the second reference voltage is equal to a supply voltage.

14. The integrated circuit of claim 1 wherein the supervoltage reference circuit comprises an output node for providing the variable reference voltage, and a first pullup transistor connected between the output node and an upper supply voltage (Vcc), the first pullup transistor having a gate coupled to receive the test mode signal and couple the output node to the upper supply voltage.

15. The integrated circuit of claim 14 further comprising a second pullup transistor coupled between the output node and the upper supply voltage, and a pulldown transistor coupled between the output node and a lower supply voltage (ground), the second pullup transistor and the pulldown transistor each having a gate coupled to receive the test mode signal and couple the output node to one-half the upper supply voltage (Vcc/2).

16. The integrated memory circuit of claim 6 wherein the supervoltage reference circuit comprises an output node for providing the first and second reference voltages, and a first pullup transistor connected between the output node and an upper supply voltage (Vcc), the first pullup transistor having a gate coupled to receive the test mode signal and couple the output node to the upper supply voltage.

17. The integrated memory circuit of claim 16 further comprising a second pullup transistor coupled between the output node and the upper supply voltage, and a pulldown transistor coupled between the output node and a lower supply voltage (ground), the second pullup transistor and the pulldown transistor each having a gate coupled to receive the test mode signal and couple the output node to one-half the upper supply voltage (Vcc/2).

18. A memory device comprising:

an input node for receiving an externally provided input voltage signal;

a detection circuit for comparing the input voltage signal to an internally generated reference voltage and detecting when the input voltage signal exceeds the reference voltage by a predetermined level; and a reference voltage circuit for generating the reference voltage based upon a test mode of the memory, the reference voltage being at first voltage level when the memory is in an active test mode, and at second voltage level when the memory is in an inactive test mode.

19. The memory device of claim 18 wherein the test mode is a burn-in test mode where a supply voltage of the memory device is raised to an upper limit.

20. A method of detecting an externally applied voltage level in a memory device, the method comprising the steps of:

initiating a test mode in the memory device where an external power supply voltage is raised above a nominal limit;

activating an internal test mode signal based upon the initiation of the test mode;

generating a reference voltage having a first voltage level in response to the active test mode signal;

monitoring a voltage level on an external input and comparing the monitored voltage with the reference voltage having a first voltage level to determine if the voltage level on an external input is above the first voltage level by a predetermined level;

deactivating the test mode;

deactivating an internal test mode signal based upon the deactivation of the test mode;

generating a reference voltage having a second voltage level in response to the deactivated test mode signal; and monitoring a voltage level on an external input and comparing the monitored voltage with the reference voltage having a second voltage level to determine if the voltage level on an external input is above the second voltage level by a predetermined level.

* * * * *